US010072881B2

(12) United States Patent
Thao et al.

(10) Patent No.: US 10,072,881 B2
(45) Date of Patent: Sep. 11, 2018

(54) REDUCED FOOTPRINT THERMOELECTRIC COOLER CONTROLLER

(71) Applicant: Hoffman Enclosures, Inc., Anoka, MN (US)

(72) Inventors: Shawn Thao, Vadnais Heights, MN (US); Jason Dickmann, Champlin, MN (US); Victor Divine, Forest Lake, MN (US); Michael Rasmussen, Ramsey, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 0 days.

(21) Appl. No.: 15/284,252

(22) Filed: Oct. 3, 2016

(65) Prior Publication Data

US 2017/0191710 A1     Jul. 6, 2017

Related U.S. Application Data

(63) Continuation-in-part of application No. 14/555,173, filed on Nov. 26, 2014, now Pat. No. 9,516,783.

(60) Provisional application No. 62/235,987, filed on Oct. 1, 2015.

(51) Int. Cl.
| | |
|---|---|
| G06F 1/16 | (2006.01) |
| H05K 5/00 | (2006.01) |
| H05K 7/00 | (2006.01) |
| F25B 21/04 | (2006.01) |
| F25B 49/00 | (2006.01) |
| H05K 7/20 | (2006.01) |

(52) U.S. Cl.
CPC .............. *F25B 21/04* (2013.01); *F25B 49/00* (2013.01); *H05K 7/20136* (2013.01); *H05K 7/20209* (2013.01); *F25B 2321/023* (2013.01); *F25B 2321/0211* (2013.01); *F25B 2321/0212* (2013.01); *F25B 2321/0251* (2013.01); *F25B 2500/17* (2013.01)

(58) Field of Classification Search
CPC ....... F25B 21/04; F25B 49/00; H05K 7/2013; H05K 7/20209
USPC .......................................................... 361/695
See application file for complete search history.

(56) References Cited

U.S. PATENT DOCUMENTS

| | | | |
|---|---|---|---|
| 6,003,319 A | 12/1999 | Gilley et al. | |
| 6,055,815 A | 5/2000 | Peterson | |

(Continued)

FOREIGN PATENT DOCUMENTS

CN          200952967 Y        9/2007

OTHER PUBLICATIONS

International Search Report and Written Opinion from the International Searching Authority for PCT/US2016/055196; dated Dec. 20, 2016; 22 pages.

*Primary Examiner* — Anthony Haughton
(74) *Attorney, Agent, or Firm* — Quarles & Brady LLP

(57) ABSTRACT

A thermal management system for an enclosure containing electrical components includes a thermoelectric cooling unit for controlling temperature inside the enclosure and a controller for the cooling unit, the controller being configured so that it can be installed within and protected by the enclosure, rather than requiring its own separate secure enclosure. The controller can further be installed within a housing of the thermoelectric cooling unit, which housing does not increase the footprint of the cooling unit.

20 Claims, 15 Drawing Sheets

(56) References Cited

U.S. PATENT DOCUMENTS

| | | | |
|---|---|---|---|
| 6,205,790 B1 * | 3/2001 | Denkin | G05D 23/1912 |
| | | | 165/255 |
| 6,220,043 B1 * | 4/2001 | Chaney, Jr. | F24F 11/008 |
| | | | 62/126 |
| 6,650,536 B2 | 11/2003 | Lee et al. | |
| 6,978,624 B2 | 12/2005 | Carlson et al. | |
| 7,290,395 B2 * | 11/2007 | Deal | F25B 21/02 |
| | | | 62/159 |
| 8,468,836 B2 | 6/2013 | Tuszkiewicz et al. | |
| 2007/0119186 A1 | 5/2007 | Kitchens et al. | |
| 2008/0098750 A1 | 5/2008 | Busier | |
| 2010/0281884 A1 * | 11/2010 | Rawski | F25B 21/04 |
| | | | 62/3.6 |
| 2012/0285180 A1 | 11/2012 | Wilkinson et al. | |

* cited by examiner

REDUCED FOOTPRINT THERMOELECTRIC COOLER CONTROLLER

RELATED APPLICATIONS

This application is a non-provisional of U.S. Prov. App. Ser. No. 62/235,987, filed Oct. 1, 2015, and having the same title, and this application is a continuation-in-part of co-pending U.S. patent application Ser. No. 14/555,173, entitled "THERMOELECTRIC COOLER CONTROLLER," and filed Nov. 26, 2014, both of which previous patent applications are incorporated fully herein by reference.

BACKGROUND

Thermal management systems are often used to provide cooling to electronic and electrical components, such as in manufacturing controls, telecom equipment, data networks, and/or other vital systems to optimize operating conditions of the electronic and electrical components. A typical thermal management system for cooling a main enclosure may include one or more cooling units, a controller, and a controller enclosure.

The main enclosure contains the electrical and electronic components that are to be cooled, and may be fireproof, which requires precise, low-tolerance design to protect the components. The cooling unit(s) are mounted within the main enclosure and may include a fan and a heat sink for removing heat from the main enclosure. The controller generally provides commands to the cooling units through an electrical signal, while power for the cooling units is provided from a separate power source. In some applications the controller may be used to power and control the cooling modules. In this situation, the wires bringing power into the controller and the wires taking power out of the controller and into the cooling units are typically hard wired to the controller, and the cooling modules are electrically connected to a terminal block of the controller. This complicates installation of the controller, swapping of a first controller for a second controller, and relocation of the thermal management system.

Most controllers do not meet the space constraints within the main enclosure and are mounted outside of the main enclosure. In order to provide the necessary hardwire connection and, in fireproof or otherwise secure applications, to enclose and protect the controller, a controller enclosure, as shown in FIG. 1, is needed. The controller enclosure may be attached to an outside surface of the main enclosure or may be attached to a surface external to the main enclosure, such as a nearby wall. This results in more material being used to build a second enclosure, more space being used up overall by the thermal management system, and more complexity in installation the thermal management system.

Accordingly, it would be useful to provide a controller that takes up less space, that does not require its own separate enclosure, and that provides for a simpler connection between an input on the controller and an output on the controller to simplify installation and modification of the thermal management system.

SUMMARY

In one embodiment, the present disclosure provides a thermal management system for an enclosure containing electrical components. The thermal management system includes a thermoelectric cooling unit mounted on the enclosure such that the cooling unit cools an interior space of the enclosure. The cooling unit has a fan for driving air into the interior space. The thermal management system further includes a controller located within the housing in electrical communication with the cooling unit and configured to operate one or more components of the cooling unit. The controller includes a circuit board, an input quick connector disposed on the circuit board and configured to receive a first cable connector for providing power to the circuit board, and an output quick connector disposed on the circuit board in electrical communication with the input quick connector and configured to receive a second cable connector for supplying power from the input quick connector to the thermoelectric cooling unit. The controller further includes one or more device headers for connecting a thermal management component, such as one or more fans. The controller can be mounted inside the enclosure, and can be mounted under a cover within the enclosure.

The controller and the cooling unit can both be mounted to an interior surface of the enclosure. The input quick connector can be a five pin connector, and can provide to the circuit board a positive voltage, a negative voltage, a common ground, a normal open, and a normal close. The output quick connector can be a two pin connector, and can supply from the controller a negative H-bridge signal and a positive H-bridge signal. The circuit board can include a thermistor connector.

In another embodiment, the present disclosure provides a controller for a thermal management unit. The controller includes a circuit board mountable to the thermal management unit or within a main enclosure managed by the thermal management unit such that the controller is enclosed within the main enclosure. The controller further includes a first quick disconnect connector disposed on the circuit board and configured to receive a first cable connector for providing power to the circuit board, and a second quick disconnect connector disposed on the circuit board and configured to receive a second cable connector for supplying power to a device controlled by the controller. The first quick disconnect connector can be a five pin connector, and can provide to the controller a positive voltage, a negative voltage, a common ground, a normal open, and a normal close. The second quick disconnect connector can be a two pin connector, and can provide from the controller a positive H-bridge signal and a negative H-bridge signal. The controller can further include one or more device headers each configured to receive a device connector cable of a device controlled by the controller. A device header can include pins for voltage out, control signal out, ground, and signal return.

The device controlled by the controller can be a fan of the thermal management unit. The control signal out of the device header can control the speed of the fan. The signal return of the device header can receive a signal from the fan indicating the fan speed. The controller can monitor the fan speed and generate an alert to a user if the fan speed is outside a predetermined operating range.

DETAILED DESCRIPTION

The present inventive controller overcomes the drawbacks of prior controllers through improvement of control circuits and application of circuit and electrical components that have not be previously applied in the described manner. As a result of the improvements, the inventive controller can have a significantly reduced form factor and simplified power connection and management, allowing the present controller to be mounted within the main enclosure. An example TEC that benefits from the present invention is the line of TE coolers by Pentair Equipment Protection, sold under the HOFFMAN brand name (e.g., TE09, TE12, TE16 products). Many other products satisfying industry standards for thermoelectric units, particularly compact, low-profile, Peltier effect heating or cooling thermoelectric units for small enclosures (collectively "TECs" herein), in particular those TECs rated at about 200 W power consumption. The TECs and controllers are described herein primarily as "cooling" units, but it will be understood that, unless otherwise indicated, the TECs and controllers can be configured to provide temperature control in the form of cooled or heated air delivered to the interior of the main enclosure.

Figure 1:
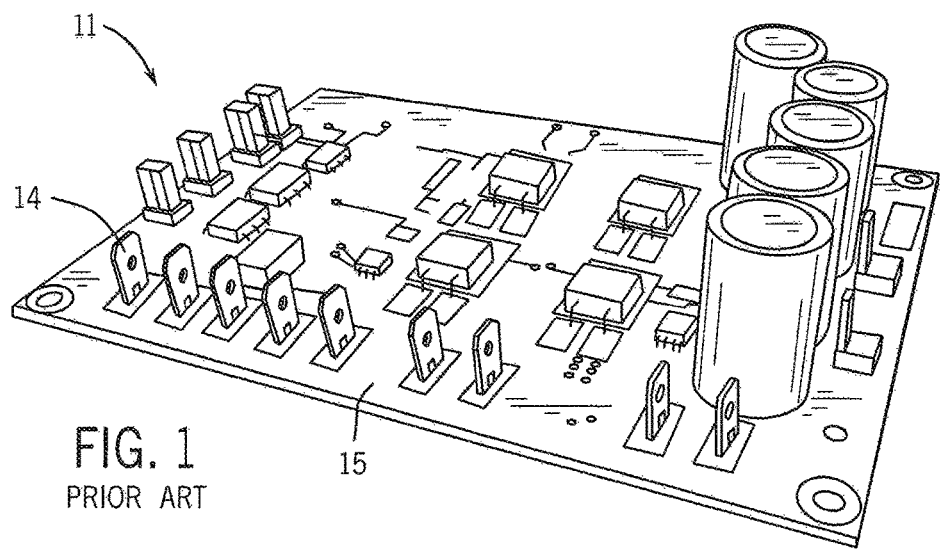
FIG. 1 is a perspective view of a prior art controller for a thermoelectric cooling unit.
Figure 2:
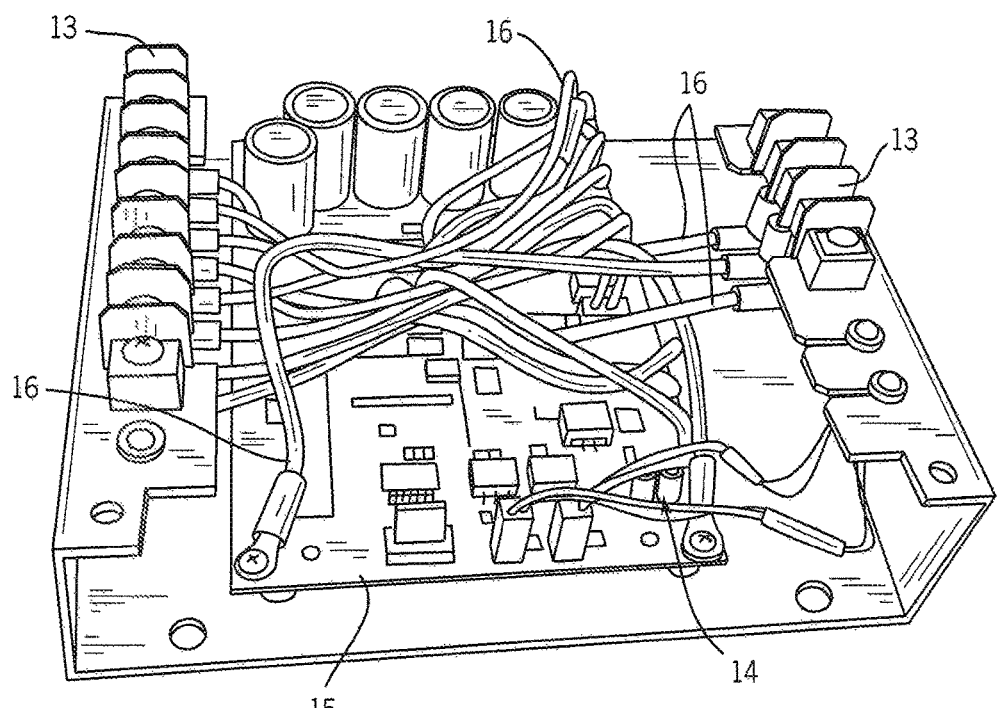
FIG. 2 is a perspective view of the controller of FIG. 1 in a controller enclosure from the prior art, the controller enclosure shown open.
Figure 3:
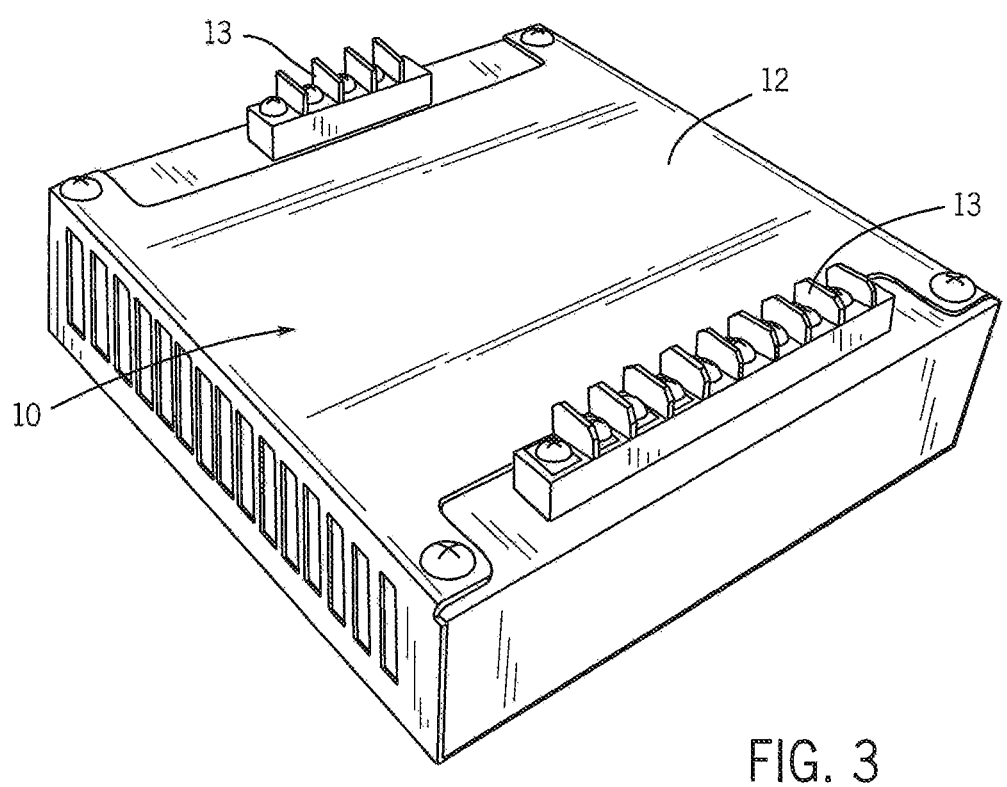
FIG. 3 is a perspective view of the controller enclosure of FIG. 2 shown closed.

For comparison purposes, FIGS. 1-3 illustrate an exemplary prior thermoelectric cooler (TEC) control module 10, which includes the TEC controller 11 installed within its own housing 12. The TEC controller 11 is designed to be hardwired to the terminal blocks 13 of the housing 12, thus requiring a plurality of wiring harness connectors 14 on the board 15 of the TEC controller 11. Correspondingly, the board 15 must have sufficient area to accommodate the connectors 14. The illustrated board 15 has dimensions of 3.85 in×5.25 in, which is typical of prior TEC controllers. Furthermore, each connector 14 is connected to a terminal of the terminal blocks 13 via a separate wiring harness 16, adding complexity, parts, and assembly time to the module 10.

Figure 4:
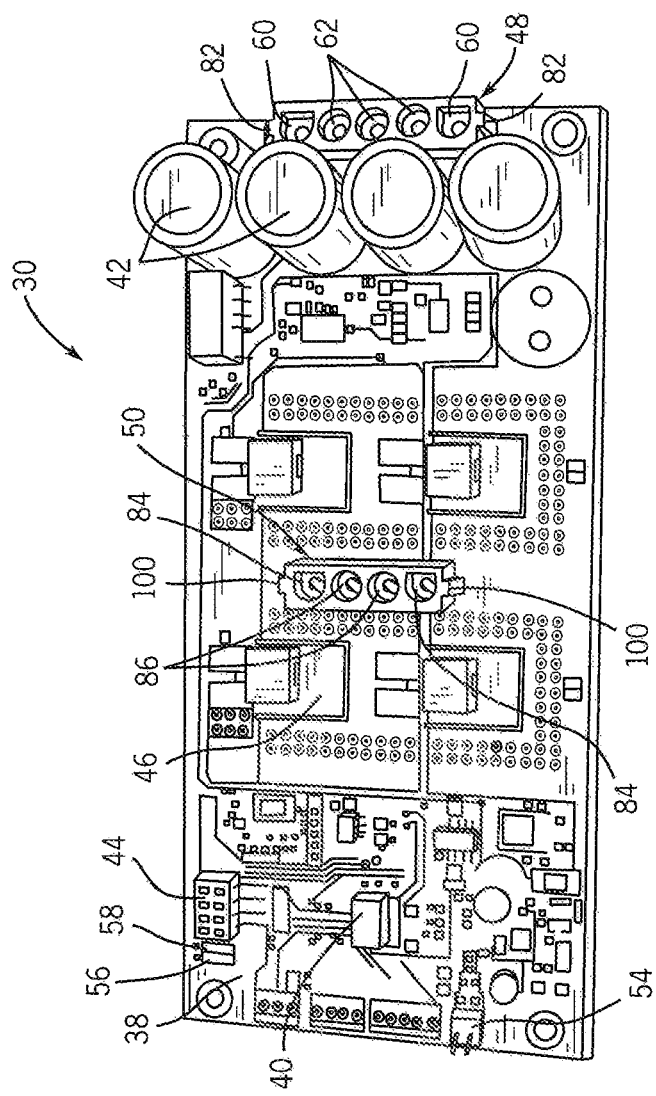
FIG. 4 is a top perspective view of a controller in accordance with the present disclosure.
Figure 5:
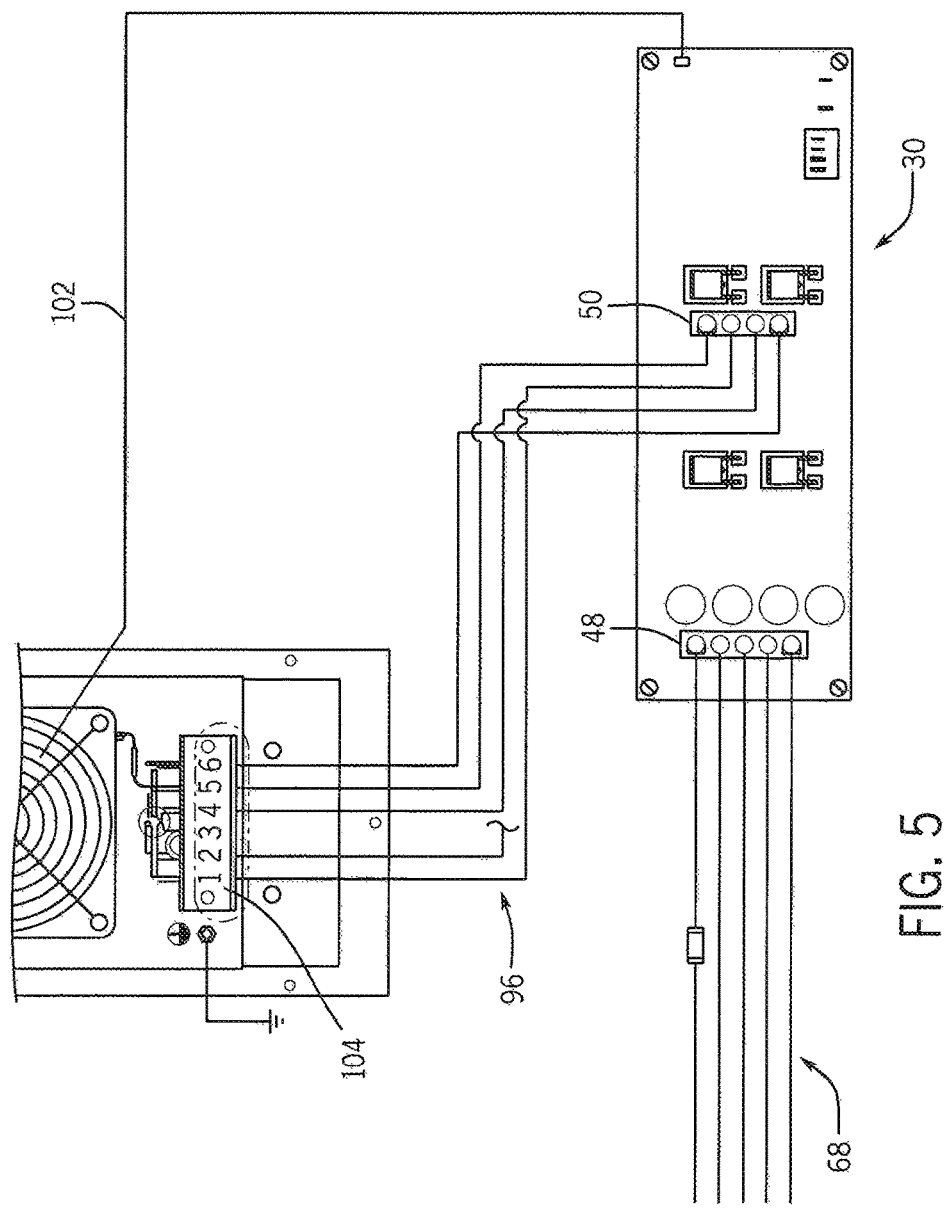
FIG. 5 is schematic view of a thermal management system using the controller of FIG. 4.
Figure 6:
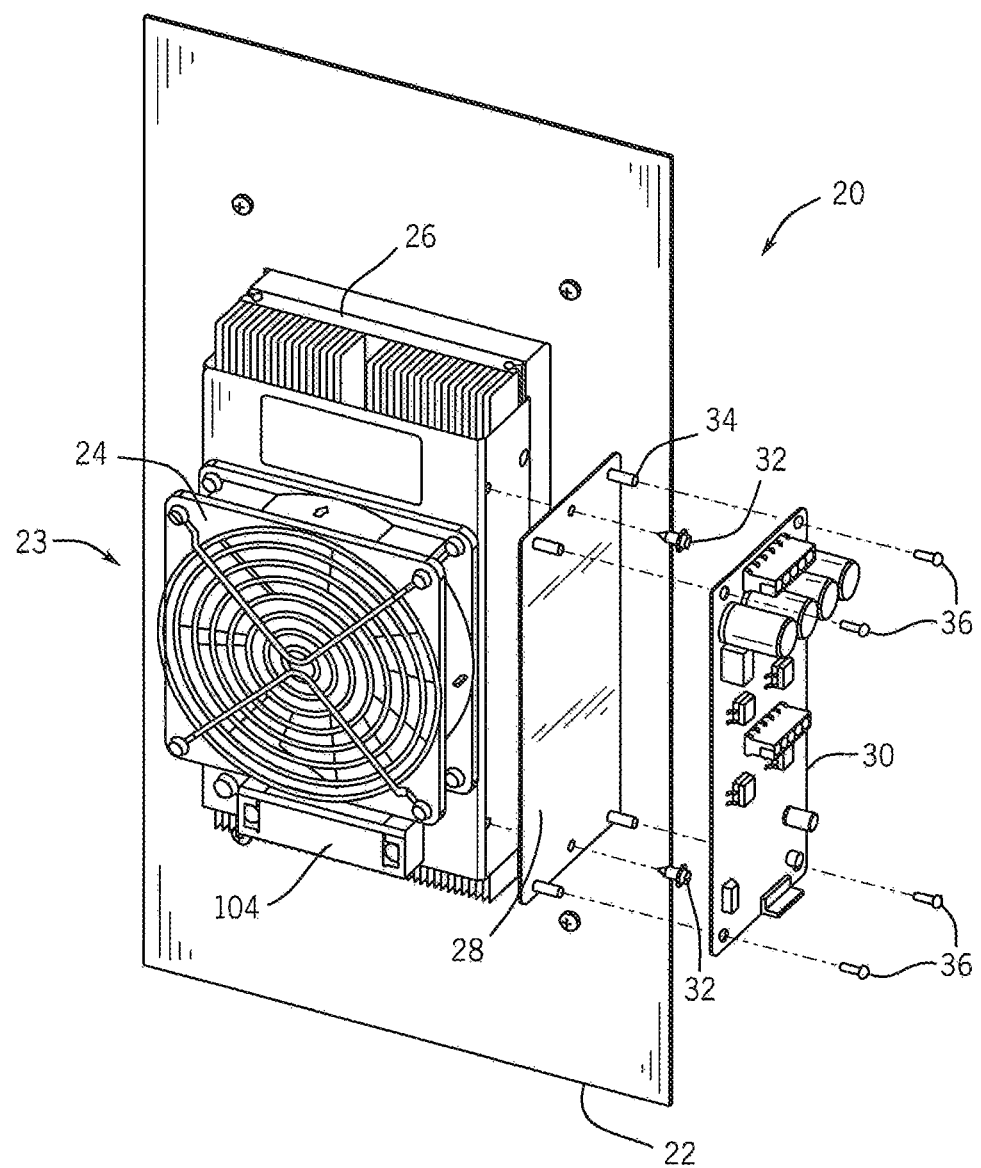
FIG. 6 is a perspective view of the controller of FIG. 4 being mounted to a thermoelectric cooling unit within a main enclosure.

Another TEC controller that addresses the drawbacks described above is described in U.S. patent application Ser. No. 14/555,173, entitled "THERMOELECTRIC COOLER CONTROLLER," filed Nov. 26, 2014, which is commonly owned by the present Applicant and is incorporated fully herein by reference. This previously described controller is referred to herein as the "STEC," and for comparison purposes is illustrated in FIGS. 4-6. Referring to FIG. 4, an exemplary STEC 30 includes a circuit board 38, a microcontroller 40, four electrolytic capacitors 42, a four position dip switch 44, a MOSFET H-bridge 46, a female input quick connector 48, a female output quick connector 50, and a thermistor connector 54. The STEC 30 achieves a circuit board 38 size that is small enough to fit inside the main enclosure typically managed by a TEC without interfering with air flow within the enclosure. In particular, the circuit board 38 may measure approximately 2.875 inches wide and 6.320 inches long. The input and output quick connectors 48, 50, and optionally the thermistor connector 54, may be the only electrical cable connectors on the circuit board 38, thus efficiently providing a one-in, one-out quick-connect power connection for both the STEC 30 and a TEC fan or other component powered from the STEC 30. The four-position dip switch 44 has the capacity to dedicate two switches to heating setpoints and two switches to cooling setpoints. Each setpoint may be used to set a target temperature for the TEC to reach, or alternatively two setpoints may be selected to act as an upper and lower desired temperature.

Referring to FIG. 5, the four-pin output connector 50 supplies a current, via circuit paths of the STEC 30, from the female input quick connector 48 to an attached four-circuit output harness 56, which is in turn connected to a component of the TEC. The female output quick connector 50 may, for example, connect to a fan 24 of the TEC (e.g., via a terminal block 104 of the TEC). The four pins of the output connector 50 may provide positive and negative fan voltage outputs for relaying power from the power supply (not shown) to the fan 24, and also provide an output for controlling the heating function of the TEC, and an output for controlling the cooling function of the TEC. A thermistor 58 can attach to the thermistor connector 54 and can be suitably positioned to detect a temperature to be monitored by the STEC 30, such as a temperature in or near the TEC or near a fan.

Referring to FIG. 6, due to its size the STEC 30 may be mounted directly to the TEC 23, which itself is mounted (e.g., using a mounting plate 28 attached to the TEC 23 by fasteners 32; the STEC 30 may then be mounted to the mounting plate 28 using a system of spacers 34 and fasteners 36) to the interior surface of a wall panel 22 of the main enclosure. The STEC 30 may alternatively be mounted elsewhere within the main enclosure, limited by space constraints therein. Protected by the main enclosure, the STEC 30 is an "open-frame" controller—it does not have its own enclosure and its components are thus exposed to anyone or anything that accesses the interior of the main enclosure.

The present disclosure additionally provides a TEC controller that adopts some of the improvements embodied in the STEC, and refines the controller layout, design, and firmware to further reduce the dimensions of the printed circuit board while adding functionality related to TEC monitoring, alarming, and networking and communication. The present disclosure further provides implementations of a closed-frame TEC controller and an integrated TEC that includes a controller enclosure for protecting the TEC controller when it is located within the main enclosure.

Figure 7:
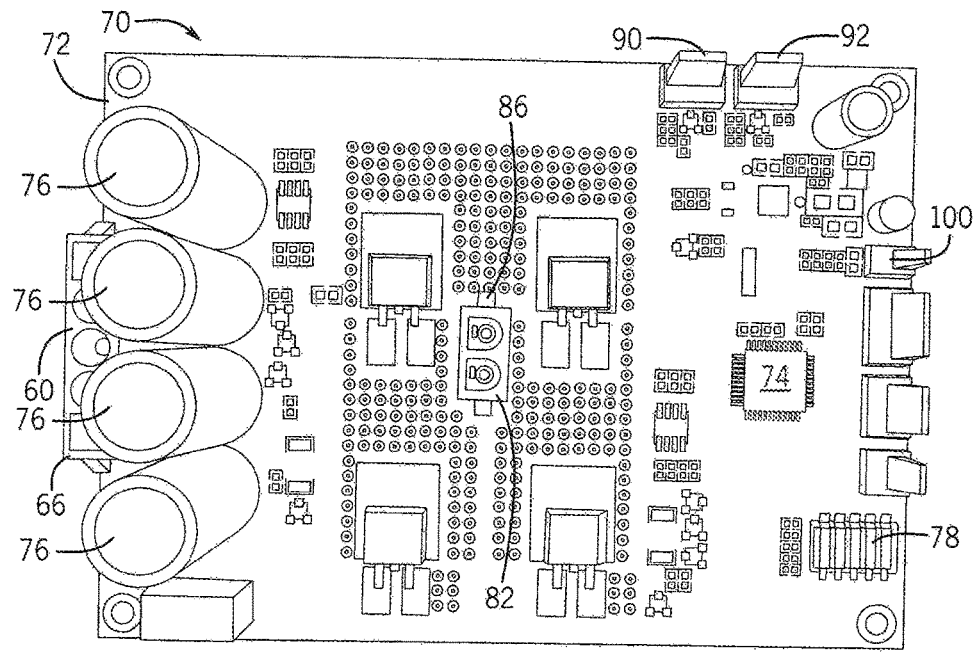
FIG. 7 is a top perspective view of another controller in accordance with the present disclosure.
Figure 8:
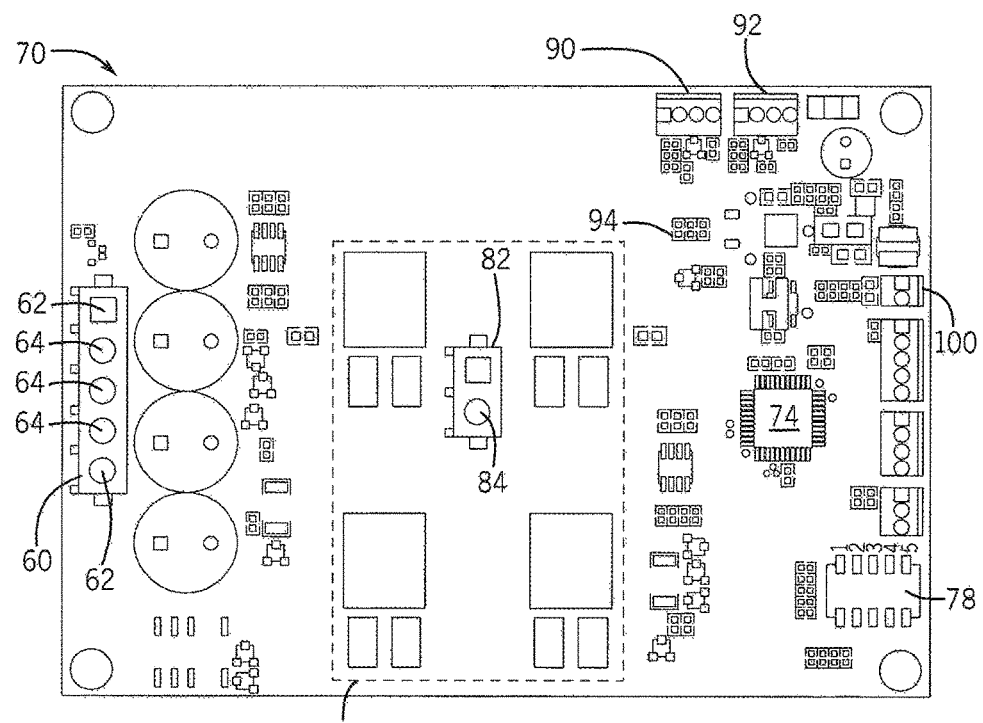
FIG. 8 is schematic view of the controller of FIG. 7.

Referring to FIGS. 7 and 8, an implementation of the present controller 70 can include a circuit board 72, a microcontroller 74, a plurality of electrolytic capacitors 76, such as four electrolytic capacitors 76, a five-position dip switch 78, a MOSFET H-bridge 80, a female input quick connector 60, a female output quick connector 82, one or more multi-pin device connection headers 90, 92, and a thermistor connector 100. The controller 70 achieves a circuit board 72 size that is small enough to fit inside the main enclosure typically managed by a TEC without interfering with air flow within the enclosure. Further, the controller 70 is small enough to be mounted under a cover or within an enclosure inside the main enclosure as described below. In particular, the circuit board 72 can measure approximately 3.850 inches wide and 5.075 inches long. See FIG. 9 for exemplary circuit diagrams of a microcontroller 74 pullout, serial, I2C, and programming ports of the controller 70, a temperature sensing circuit for processing input to the thermistor connector 100, and visual indicator (e.g., LED) activation circuits.

Figure 10:
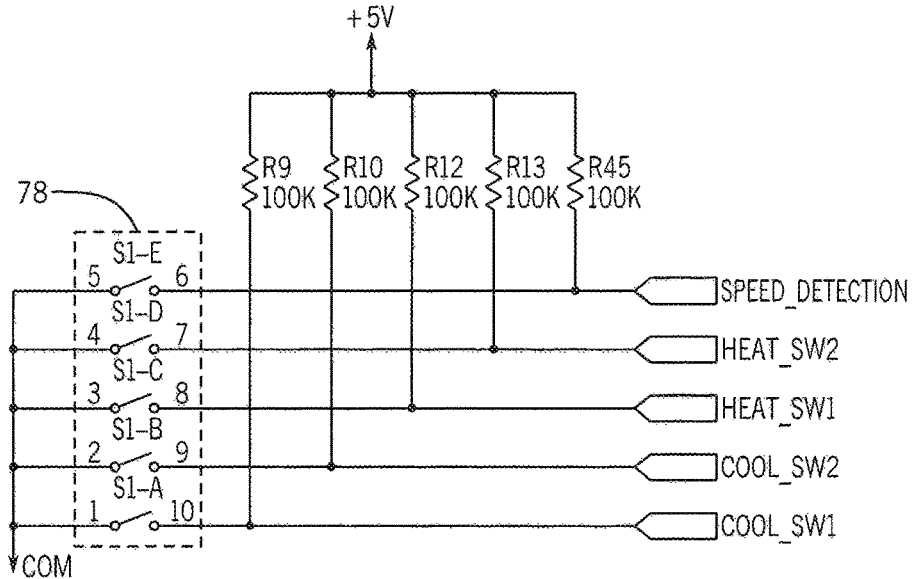

The five-position dip switch 78 can have two switches dedicated to heating setpoints and two switches dedicated to cooling setpoints. Each setpoint can be used to set a target temperature for the cooling system to reach, or alternatively two setpoints can be selected to act as an upper and lower desired temperature. The two heating setpoints may represent two selectable target temperatures for the thermal management system to heat to, while the two cooling setpoints may represent two selectable target temperatures to cool to. A fifth switch of the dip switch 78 can be used to select the speed of the fan inside the enclosure when the heating and cooling functions are not operating. In one position, the fan runs full speed during an off time, and in the other position, the fan will slow to half speed during an off time. See FIG. 10.

Figure 12:
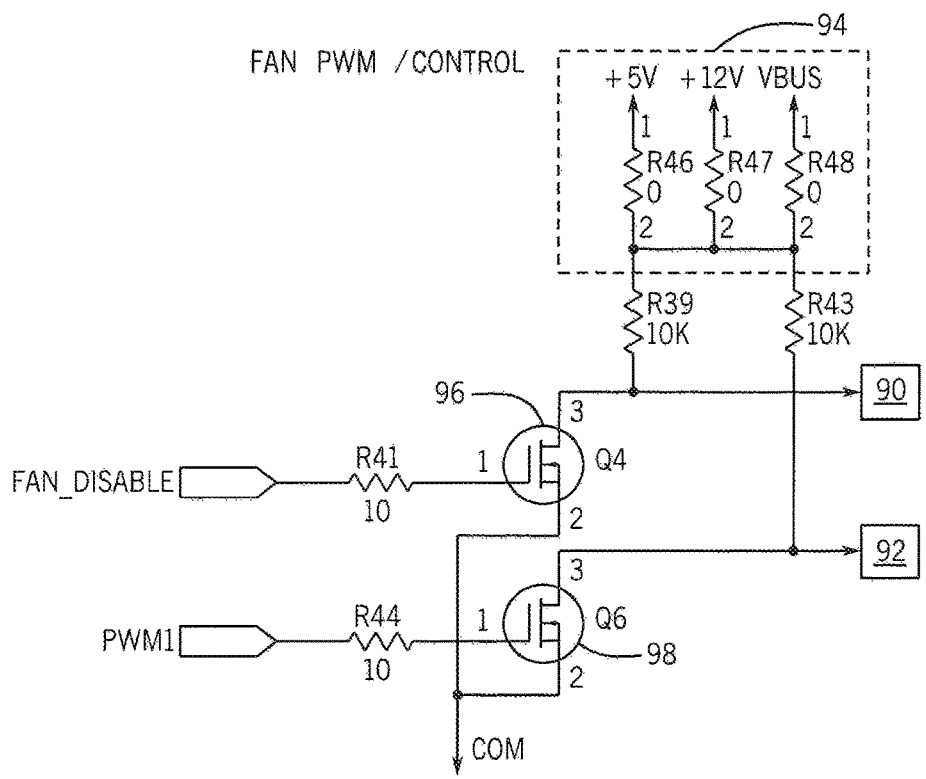
Figure 11:
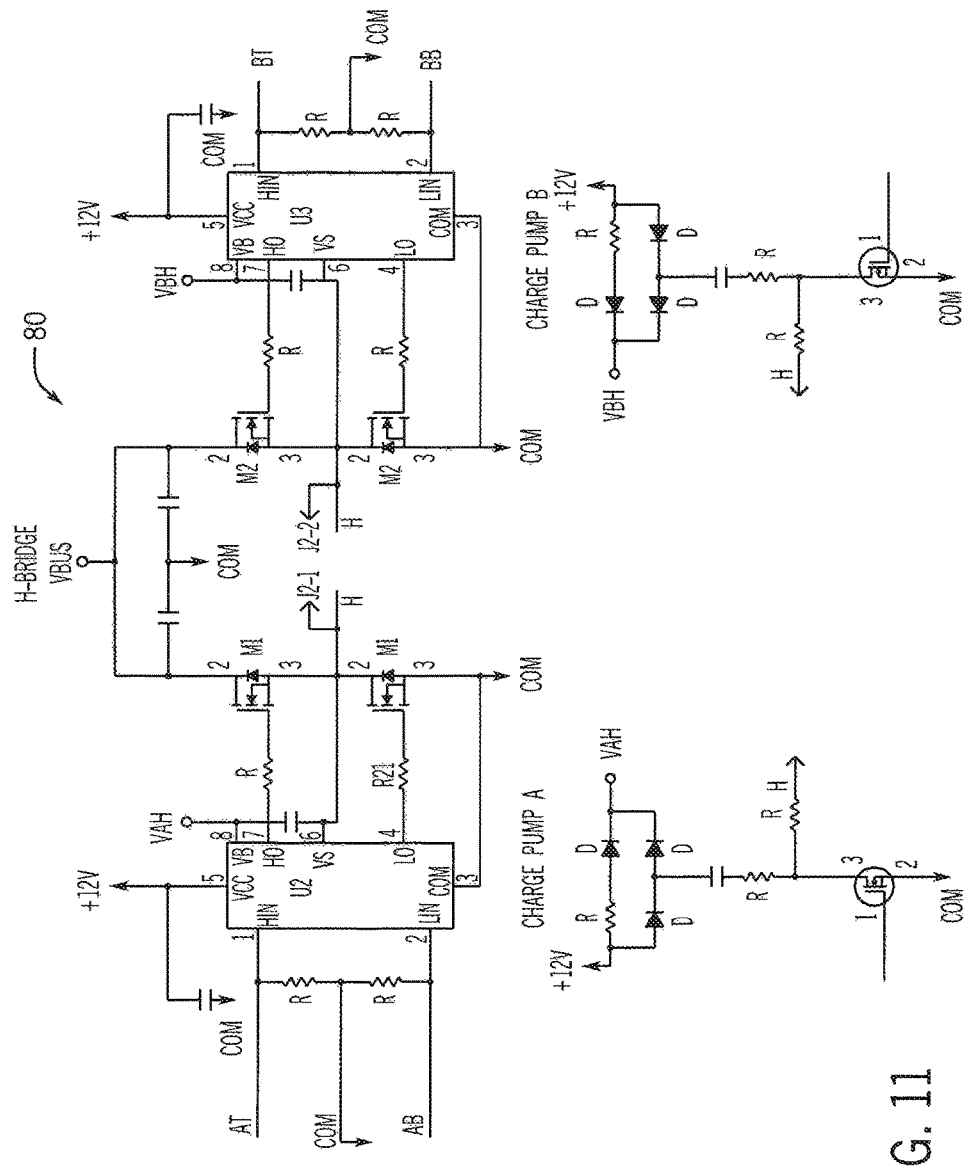

The H-bridge 80 in the illustrated embodiment comprises four MOSFET transistors, but may be formed with an integrated circuit or other suitable discrete components. See FIG. 11 for exemplary circuit diagrams of the H-bridge 80 and suitable charge pumps therefor. In some embodiments, the positive H-bridge output may be used to provide heating to the TEC, while the negative H-bridge output may be used to provide cooling to the TEC; typically, either the positive or negative H-bridge is operating, while the other is idle. The H-bridge 80 can provide an adjustable pulse width modulated (PWM) signal, between 10% and 100% of the full available electrical power, as an output of one or more of the transistors. For example, the PWM signal can be sent through the positive H-bridge output and through the negative H-bridge output. The PWM signal can be applied to the TEC and components thereof. For example, by increasing the PWM signal the rotational speed of a fan may be increased to move more air through the TEC. FIG. 12 illustrates an exemplary circuit for transistors 96, 98 of the H-bridge 80 to pass a PWM signal PWM1 to a contact (e.g., a pin) of each header 90, 92. A jumper block 94 can be used to match the voltage of the PWM signal to that required by the device attached to each of the headers 90, 92. The microcontroller 74 can thus control the fan speed to, for example, reduce noise generated by the fans.

Referring again to FIGS. 7 and 8, the female input quick connector 60 may be a rectangular female connector having five pin receiving holes. The pin receiving holes are preferably arranged in a line to minimize the space taken on the circuit board 72 with respect to other components, described below. The two outer pin holes can be keyed pin receiving holes 62, such as with a square having one arched side, with the two keyed pin receiving holes 62 having an arch on the same side, and the three inner pin holes may all be circular pin receiving holes 64. The keyed holes 62 may require that a male input quick connector attached to an input harness may be attached to the female input quick connector 60 in only one orientation. The pin receiving holes 62 and 64 may, for example, be configured to receive an input current from a power supply. In an example configuration, the pin receiving holes 62, 64 include a negative voltage inlet, a positive voltage inlet, a normal open inlet, a common ground inlet, and a normal close inlet. In some embodiments, the female input quick connector 60 may be configured as a five-circuit Universal MATE-N-LOK connector produced by Tyco Electronics.

Figure 13:
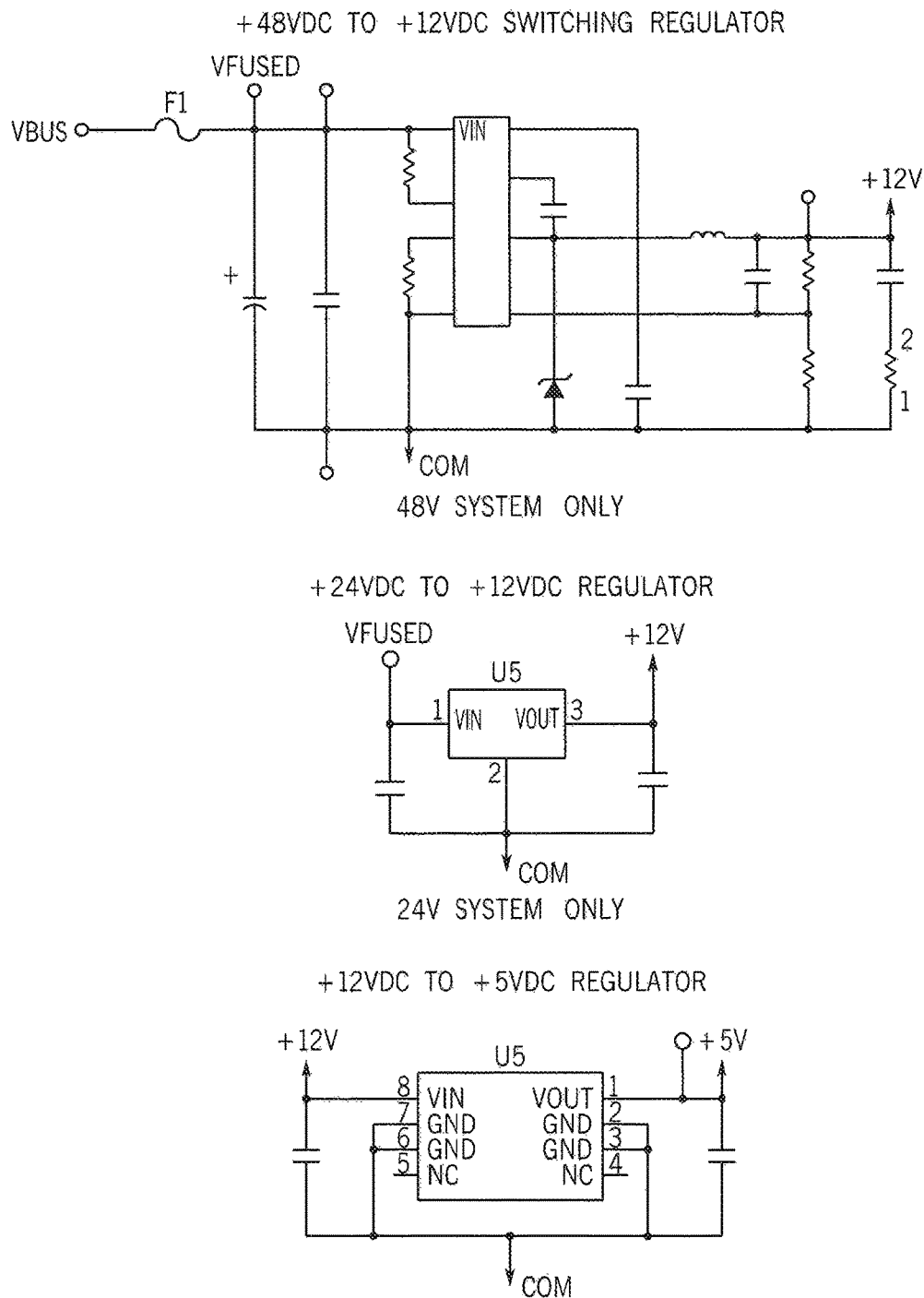

The female input quick connector 60 may couple to an input harness (e.g., input harness 68 of FIG. 5) having a male input quick connector (not shown) with the same number of pin holes as the female input quick connector 60 and similarly keyed. The male input quick connector may attach in a detachable manner to a pair of protrusions 66 extending from opposite sides of the female input quick connector 60, and adjacent to the keyed pin receiving holes 62, to quickly and securely attach the input harness to the controller 70. The input harness may connect the controller 70 to a power source (not shown) that delivers either 24 VDC or 48 VDC electric current to the controller 70 through the input harness. The controller 70 can include switching regulators for stepping down the voltage (e.g., from 48 VDC to 12 VDC, from 24 VDC to 12 VDC, and/or from 12 VDC to 5 VDC) as needed for various components disposed on or powered by the controller 70. See FIG. 13.

The female output quick connector 82 may be, for example, a rectangular female connector having two keyed pin receiving holes 84 in a line. In some embodiments, the female output quick connector 82 may be configured as a two-circuit Universal MATE-N-LOK connector produced by Tyco Electronics. The pin receiving holes 84 may, for example, be electrically connected to a first output from the H-bridge 80, which may be a positive H-bridge output for controlling the heating function of the TEC, and to a second output from the H-bridge 80, which may be a negative H-bridge output for controlling the cooling function of the TEC (or, the positive and negative control functions may be reversed). The female output quick connector 82 can deliver the received output(s) from the H-bridge 80 to an attached, compatible two-circuit output harness (not shown) which connects to the TEC. A male output quick connector of the output harness may attach in a detachable manner to a pair of protrusions 86 extending from opposite sides of the female output quick connector 82, and adjacent to the keyed pin receiving holes 84, to quickly and securely attach the output harness to the controller 70.

Figure 14:
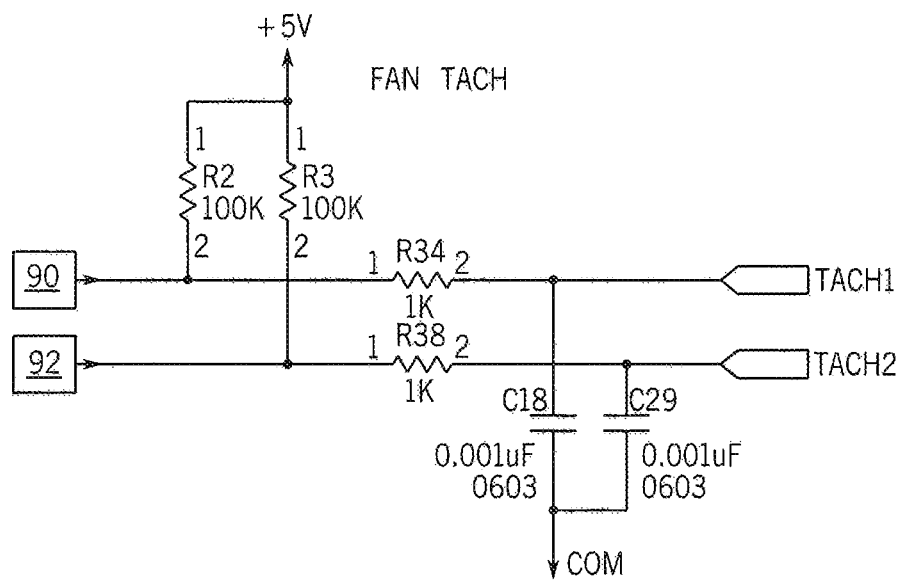

Similarly, each of the device headers 90, 92 may receive one or more signals from components of the controller 70, such as the H-bridge 80 and/or the microcontroller 74, to control an external device, such as a fan or other component of the TEC. The headers 90, 92 may be quick-connection headers, such as male 4-pin headers, or other quick connectors as described above. In one embodiment, the headers 90, 92 each have a pin that receives a positive output voltage to be delivered to the attached device, a pin connected to ground or receiving a "negative" (relative to the output voltage on the other pin) voltage, a pin that receives a PWM signal, as described above with respect to FIG. 12, and outputs it to the attached device, and a pin that receives a signal back from the attached device. In an exemplary embodiment, described further below, the controller 70 controls a TEC having two fans, and power (i.e., the output voltage) and potentially other operating signals (e.g., the PWM signal) are supplied to each fan via connection of a fan harness between the fan and one of the headers 90, 92. In the exemplary embodiment, the headers 90, 92 receive a fan speed (i.e. a tachometer or TACH) signal back from the corresponding attached fan. See FIG. 14 for an exemplary circuit diagram of a fan speed detection circuit that takes the fan speed signal delivered to each header 90, 92 from each fan as input, and delivers the fan speed signal to the microcontroller 74 for analysis. The microcontroller 74 can determine whether or not either of the connected fans is operating, and at what speed, in order to generate and send a new PWM signal for controlling the fan speed when the fan speed should be changed (based on other signals processed by the microcontroller 74).

Figure 9:
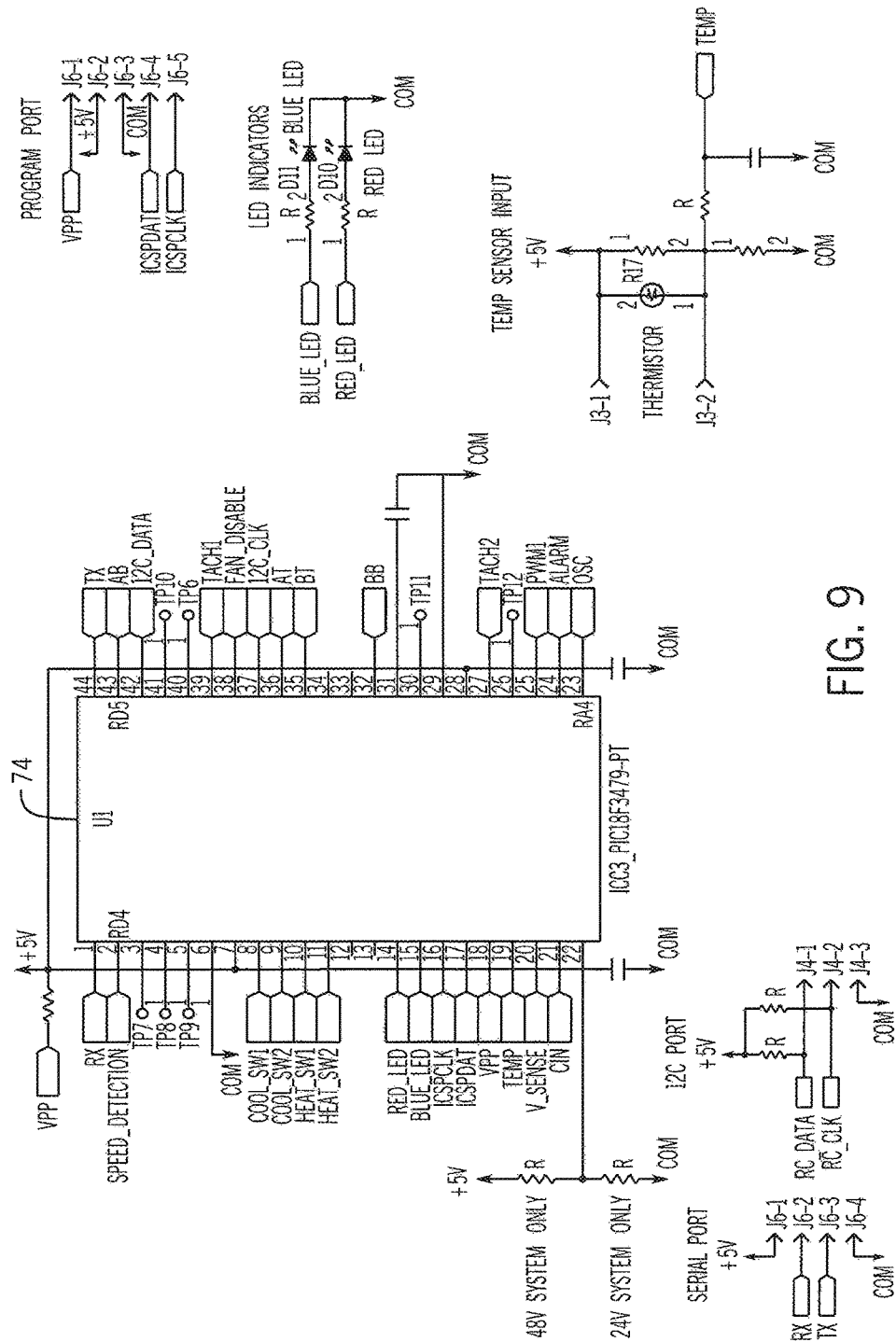
FIGS. 9-17 are circuit diagrams of components of the controller of FIG. 7.
Figure 15:
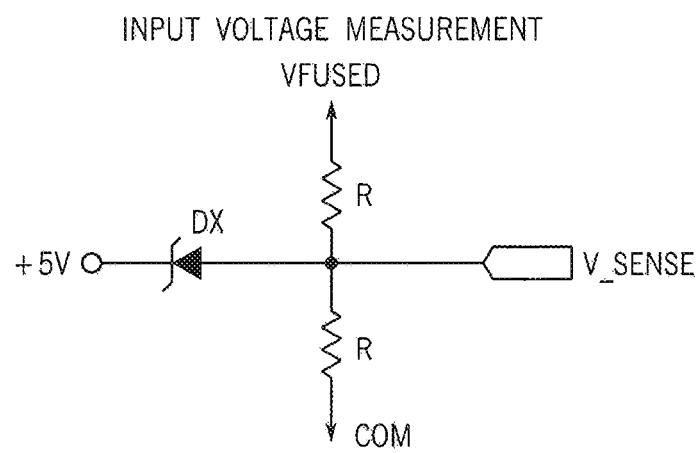
Figure 16:
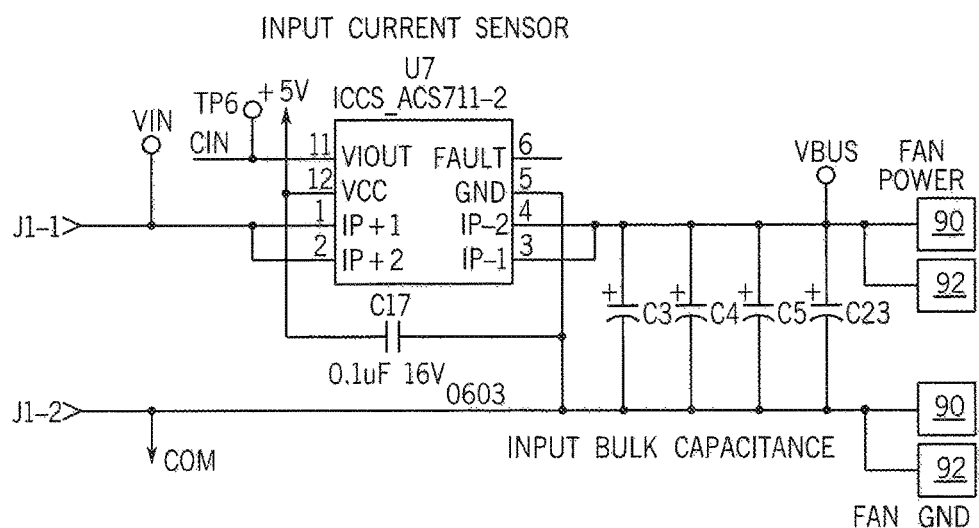
Figure 17:
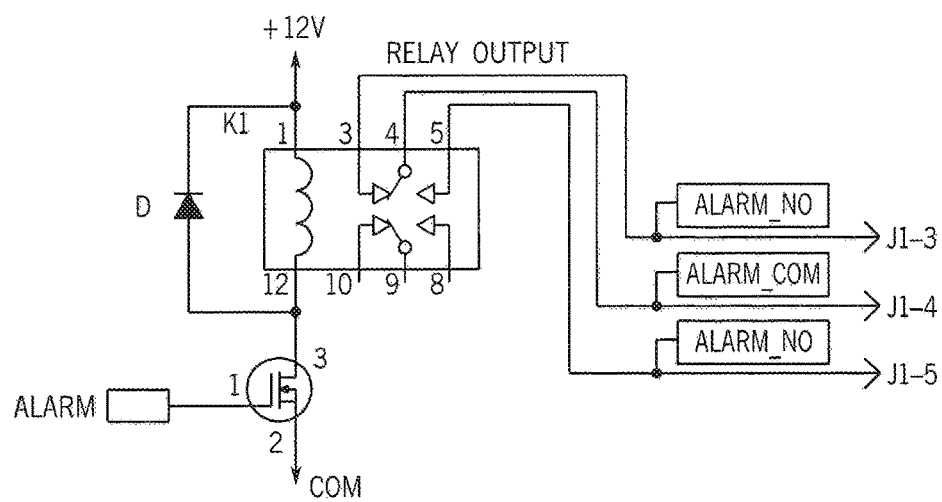
Figure 18:
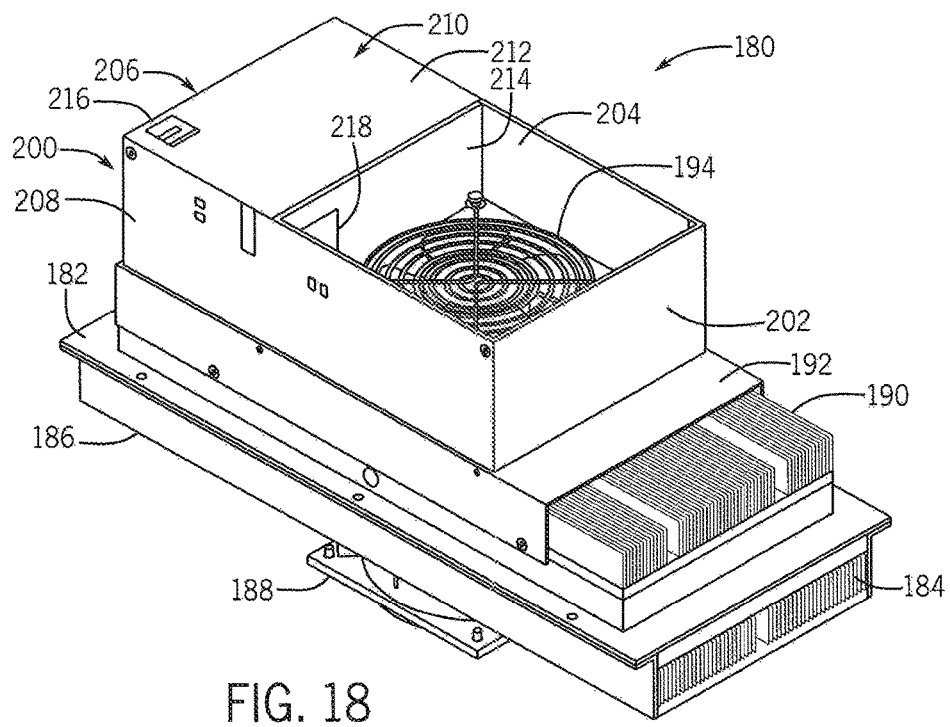
FIG. 18 is a bottom front perspective view of a thermoelectric cooler in accordance with the present disclosure.
Figure 19:
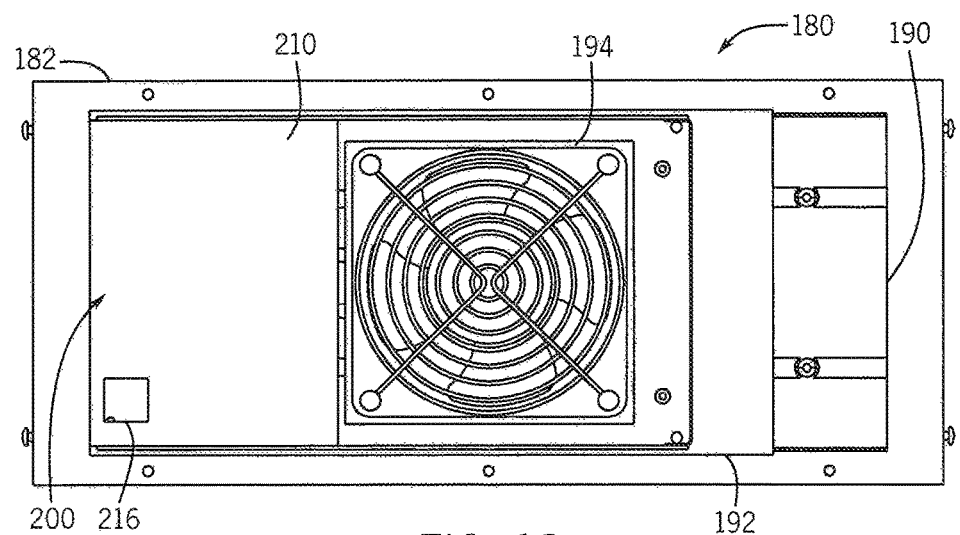
FIG. 19 is a bottom view of the cooler of FIG. 18.
Figure 20:
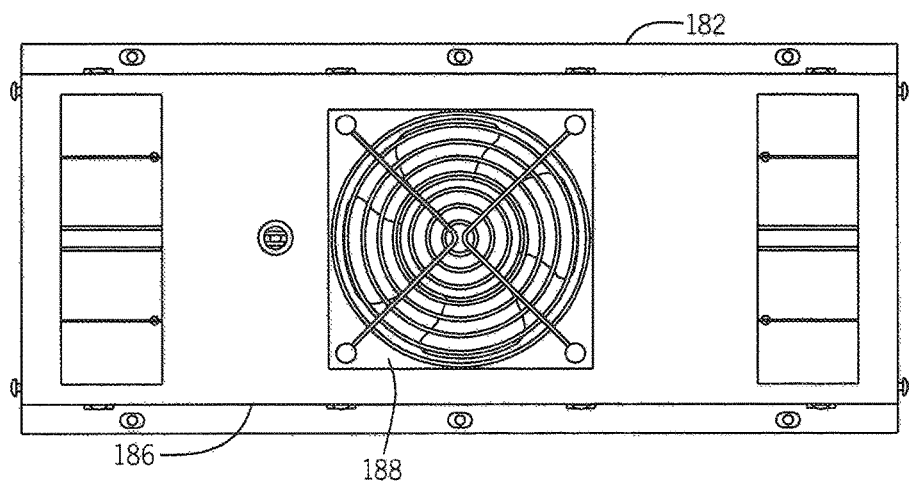
FIG. 20 is a top view of the cooler of FIG. 18.

A thermistor (e.g., thermistor 102 of FIG. 5) may connect to the thermistor connector 100 and can supply a temperature signal to the microcontroller 74, as shown in the temp sensor input circuit of FIG. 9. The microcontroller 74 can use the temperature signal to, for example, automatically adjust the PWM signal that controls the fans, as shown in the fan PWM/control circuit of FIG. 12. Furthermore, the controller 70 can determine from the temperature signal whether to generate an alert to an operator that the temperature is above or below a preset temperature range, or that the temperature signal is malfunctioning. The controller 70 can similarly monitor other parameters of the TEC or the controller, including without limitation: the fan speed, as described above; the input voltage to the controller 70, with an input voltage measurement circuit such as that shown in FIG. 15; and, the current consumed (i.e., input current) by the TEC and/or the fans, with an input current monitoring circuit such as that shown in FIG. 16. The microcontroller 74 can generate one or more audible or visual alarms if any of the monitored signals is outside of a preset range, using a relay output circuit such as that of FIG. 17. In some embodiments, the controller 70 can be configured so that the microcontroller 74 uses a single relay and single alarm output to communicate the alarm, regardless of the parameter that causes the alarm.

The controller 70 can be configured to automatically detect the operating voltage capability. The controller 70 can include one or more communication modules that enable remote access and control. The communication module can communicate with a user device using any suitable protocol, such as SNMP or modbus TCP protocol. The controller can additionally or alternatively include one or more communication modules that enable the controller 70 to communicate with other TEC controllers in a network. Any suitable communication module can be used, such as an RS-485 converter.

FIGS. 18-24 illustrate an implementation of an unshrouded thermoelectric cooler 180 for a sealed enclosure. The cooler 180 uses the Peltier effect to remove heat from around critical or temperature-sensitive electronic equipment contained in the enclosure, and is also configured to contain and protect the controller 70 of the present disclosure. Typical TEC components of the cooler 180 include, without limitation: a frame 182 that mounts the cooler 180 to the enclosure; an external heat sink 184 for dissipating heat, the external heat sink 184 mounted to the frame 182 so that the external heat sink 184 is outside of the enclosure when the cooler 180 is installed; optionally, a sleeve 186 for the external heat sink 184, the sleeve 186 mounting to the frame 182 or to the external heat sink 184 and providing a planar surface for mounting additional components; an external fan 188 mounted to the frame 182 or to the sleeve 186 and drawing air into the cooler 180; an internal heat sink 190 for dissipating heat, the internal heat sink 190 mounted to the frame 182 so that the internal heat sink 190 is inside the enclosure when the cooler 180 is installed; optionally, a sleeve 192 for the internal heat sink 190, the sleeve 192 mounting to the frame 182 or to the internal heat sink 190 and providing a planar surface for mounting additional components; and, an internal fan 194 mounted to the frame 182 or to the sleeve 192 and circulating air within the enclosure.

A housing 200 for the present controller can be attached to the frame 182, the internal heat sink 190, the sleeve 192, or another suitable component of the cooler 180 (e.g., one of the external components). The housing 200 can include a front wall 202, a left wall 204, a rear wall 206, and a right wall 208 that are attached to or integral with each other, defining an interior space of the housing 200. In some implementations, the interior space can be just large enough to contain the controller 70. In other implementations, including the illustrated implementation, the interior space can be larger. For example, the housing 200 can contain all or part of the internal fan 194 within a compartment of the housing 200 separated from the controller by a cover 210 described below.

A cover 210 can span all or a portion of the interior space defined by the walls 202-208. In some implementations, the cover 210 can include a first member 212 that extends across the interior space (e.g., parallel to the frame 182 or orthogonal to the walls 202-208) and is attached to or integral with a second member 214 extending from the first member 212 (e.g. parallel to the walls 202-208) into and dividing the interior space. As illustrated, the cover 210 creates a second interior space that is divided from the interior space containing the internal fan 194. The cover 210 can include one or more functional apertures. In one example, a first aperture 216 can be disposed through the cover 210, facilitating connection of a thermistor to the controller 70 as described above. In another example, a second aperture 218 can be disposed through the cover 210 near the internal fan 194, providing airflow through the second interior space.

Figures 21, 22:
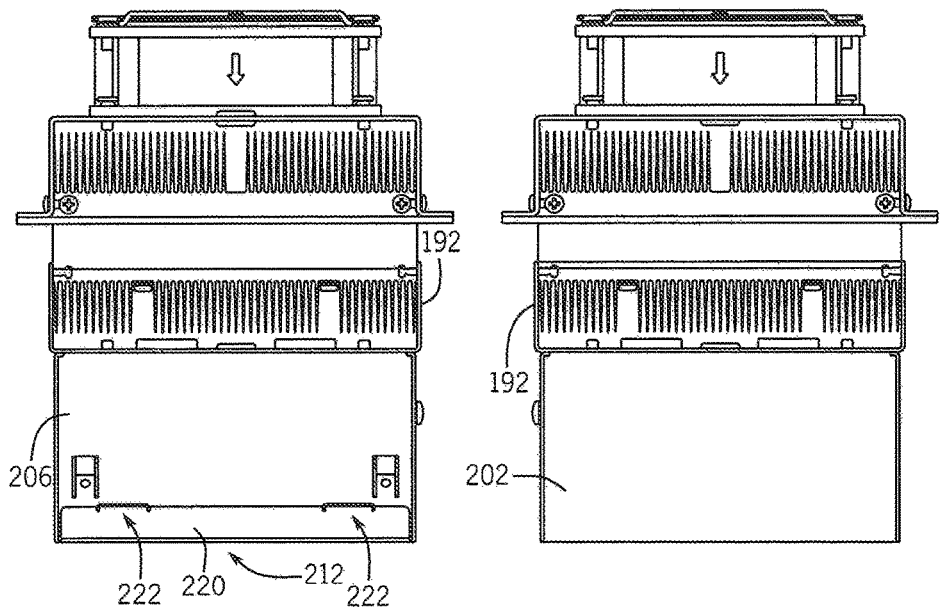
FIG. 21 is a rear view of the cooler of FIG. 18.
FIG. 22 is a front view of the cooler of FIG. 18.
Figure 23:
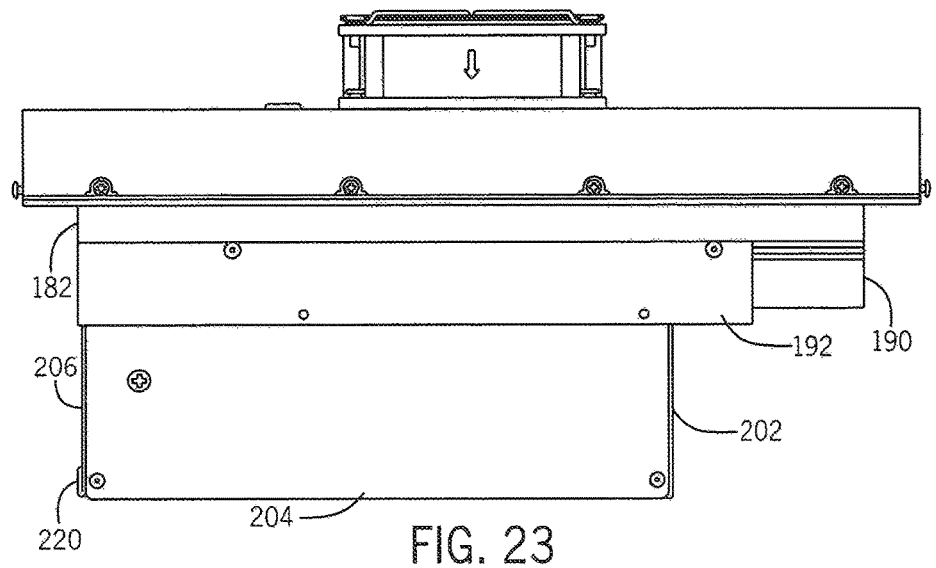
FIG. 23 is a left view of the cooler of FIG. 18.

Referring to FIG. 21, the cover 210 can further include an attachment member 220 attached to or integral with the first member 212 and being configured to attach the cover 210 to one of the walls 202-208, such as the rear wall 206. Any suitable attachment mechanism(s) can be used to attach the cover 210 to the wall(s), including without limitation welds, fasteners such as rivets or screws, hinges, or, as illustrated, tabs 222 disposed through slots in the wall (e.g., rear wall 206).

Figure 24:
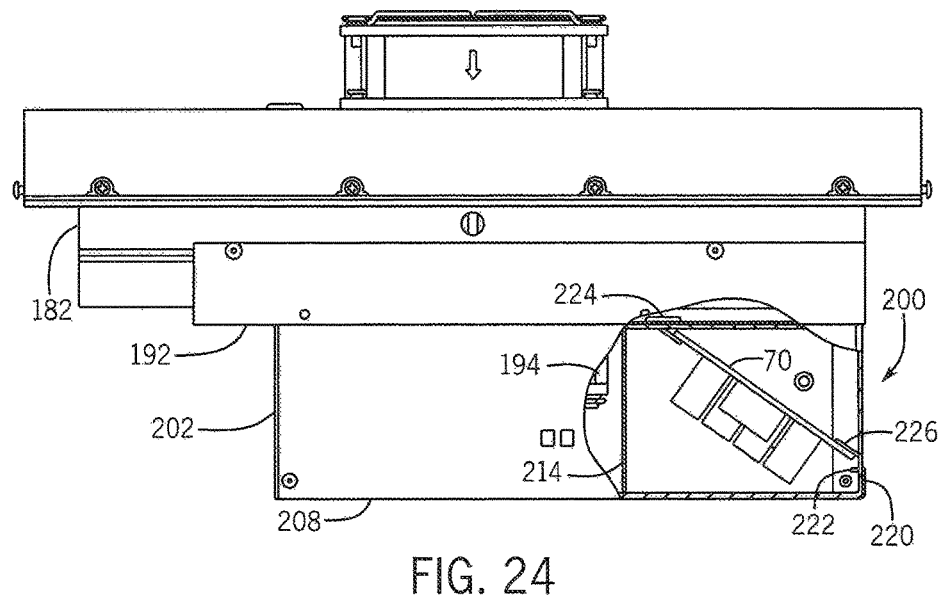
FIG. 24 is a right view of the cooler of FIG. 18.

FIG. 24 illustrates an embodiment of mounting the controller 70 in the housing 200. The controller 70 can be attached on one side with a first bracket 224 to for example, the sleeve 192. The controller 70 can be mounted at an acute angle α to the sleeve 192 (which establishes a vertical plane of reference when the TEC is installed in an enclosure) in a manner that disposes the controller 70 under the cover 210. The controller 70 can be attached on its other side with a second bracket 226 to the rear wall 206. The brackets 224, 226 can be any suitable bracket for attaching the substrate (e.g., PCB) of the controller 70 to the surfaces of the cooler 180, which are typically metal. In particular, the cooler 180 can be a fire proof or fire resistant cooler for a fire proof enclosure, and the walls, sleeves, and other surfaces of the cooler 180 can be made out of a fire proof material, such as metal, to prevent a fire from spreading into the enclosure from outside of the enclosure, or to prevent a fire escaping out of the enclosure from within the enclosure.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

What is claimed is:

1. A thermal management system for an enclosure containing electrical components, the thermal management system comprising:
   a thermoelectric cooling unit mounted on the enclosure such that the cooling unit heats and cools, in different operating modes, an interior space of the enclosure, the cooling unit comprising:
      a frame attaching to the enclosure to mount the cooling unit to the enclosure;
      a first fan mounted on an external side of the frame and pulling air into the cooling unit;
      an internal heat sink attached to the frame on an internal side of the frame that faces into the interior space when the cooling unit is installed on the enclosure;
      a housing mounted on the frame and extending into the interior space of the enclosure when the cooling unit is installed on the enclosure, the internal heat sink being disposed between the frame and the housing; and
      a second fan mounted on the frame for circulating air within the interior space; and
   a controller in electrical communication with the cooling unit, the controller being located within the housing and comprising:
      a circuit board;
      an input quick connector disposed on the circuit board and configured to receive a first cable connector for providing power to the circuit board;
      an output quick connector disposed on the circuit board in electrical communication with the input quick connector, and configured to receive a second cable connector for supplying a first control signal and a second control signal to the cooling unit, the first control signal controlling a cooling operating mode of the cooling unit, and the second control signal controlling a heating operating mode of the cooling unit;
      a first device header configured to receive a third cable connector for supplying power from the input quick connector to the first fan; and
      a second device header configured to receive a fourth cable connector for supplying power from the input quick connector to the second fan.

2. The thermal management system of claim 1, wherein the controller is mounted at an acute angle with respect to vertical within the housing.

3. The thermal management system of claim 1, wherein the housing further contains all or part of the second fan.

4. The thermal management system of claim 1, wherein:
   the input quick connector provides to the circuit board a positive voltage, a negative voltage, a common ground, a normal open, and a normal close;
   the output quick connector is a two pin connector in which a first pin supplies a positive H-bridge signal as the first control signal and a second pin supplies a negative H-bridge signal as the second control signal; and
   the first device header is a four pin connector that supplies a positive fan voltage, a negative fan voltage, and a pulse-width modulated speed signal to the first fan, and that receives a fan speed signal from the first fan.

5. A thermal management system for an enclosure containing electrical components, the thermal management system comprising:
   a thermoelectric cooling unit comprising:
      a frame that mounts the cooling unit to the enclosure such that the cooling unit cools a first interior space of the enclosure;
      a housing mounted on the frame and being disposed within the enclosure when the cooling unit is installed on the enclosure; and
      a first fan mounted on the frame for circulating air within the interior space; and
   a controller in electrical communication with the cooling unit and configured to operate one or more components of the cooling unit, the controller comprising a circuit board mounted within the housing at an acute angle with respect to a vertical plane of reference of the enclosure.

6. The thermal management system of claim 5, wherein the controller comprises a two-pin output quick connector.

7. The thermal management system of claim 6, wherein the controller further comprises a first device header electrically connected to the cooling unit to control the first fan.

8. The thermal management system of claim 7, wherein:
   the output quick connector supplies from the controller a negative H-bridge signal and a positive H-bridge signal; and
   the first device header supplies from the controller a positive first fan voltage, a negative first fan voltage, and a first pulse-width modulated speed signal, and receives from the first fan a first fan speed signal.

9. The thermal management system of claim 8, wherein the negative H-bridge signal controls a cooling operation of the cooling unit, and the positive H-bridge signal controls a heating operation of the cooling unit.

10. The thermal management system of claim 8, wherein:
   the cooling unit further comprises a second fan mounted on the frame for pulling air into the enclosure; and
   the controller further comprises a second device header mounted on the circuit board and electrically connected to the cooling unit to control the second fan, the second device header supplying from the controller a positive second fan voltage, a negative second fan voltage, and a second pulse-width modulated speed signal, and receiving from the second fan a second fan speed signal.

11. The thermal management system of claim 6, wherein the circuit board includes a thermistor connector.

12. The thermal management system of claim 5, further comprising a cover dividing the housing into a first compartment and a second compartment, the first compartment containing all or a part of the first fan, and the second compartment containing the controller, the cover enclosing the second compartment.

13. The thermal management system of claim 12, wherein the cover comprises an aperture for connecting a thermistor to the controller from external the housing.

14. The thermal management system of claim 5, wherein the cooling unit further comprises:
   an internal heat sink attached to the frame and disposed within the enclosure when the cooling unit is installed on the enclosure; and
   a sleeve attached to the frame and disposed over the internal heat sink, the housing being mounted on the frame via attachment of the housing to the sleeve.

15. The thermal management system of claim 12, wherein:

the housing further comprises a first wall, a second wall attached to or integral with the first wall, a third wall attached to or integral with the second wall, and a fourth wall attached to or integral with the third wall and the first wall, the first wall, second wall, third wall, and fourth wall extending orthogonally away from the frame to define a second interior space of the housing;

the cover comprises a first member extending parallel to the frame across a portion of the second interior space, and a second member integral with the first member and extending orthogonally from the first member into the second interior space to create the first compartment and the second compartment; and the acute angle is selected to allow the controller to be disposed within the first compartment enclosed by the cover.

16. The thermal management system of claim 15, wherein the cooling unit further comprises an external heat sink mounted on the external side of the frame and being disposed outside of the enclosure when the cooling unit is installed on the enclosure.

17. A thermal management system for an enclosure containing electrical components, the thermal management system comprising:

a thermoelectric cooling unit mounted on the enclosure such that the cooling unit heats and cools, in different operating modes, an interior space of the enclosure, the cooling unit comprising:

a frame attaching to the enclosure to mount the cooling unit to the enclosure;

a first fan mounted on an external side of the frame and pulling air into the cooling unit;

an internal heat sink attached to the frame on an internal side of the frame that faces into the interior space when the cooling unit is installed on the enclosure; and a second fan mounted on an internal side of the frame for circulating air within the interior space; and a controller in electrical communication with the cooling unit, the controller being located within the enclosure such that the internal heat sink is disposed at least partially between the frame and the controller.

18. The thermal management system of claim 17, wherein the cooling unit further comprises a housing mounted on the internal side of the frame, the internal heat sink being disposed between the frame and the housing, and the controller being disposed within the housing.

19. The thermal management system of claim 18, further comprising a cover enclosing at least a portion of the housing, wherein the controller comprises a circuit board mounted at an acute angle, with respect to vertical when the cooling unit is installed on the enclosure, within the housing, the acute angle selected to allow the controller to be disposed within the portion of the housing enclosed by the cover.

20. The thermal management system of claim 18, wherein the housing further contains all or part of the second fan.

* * * * *